(12) United States Patent
Lin et al.

(10) Patent No.: US 6,277,685 B1
(45) Date of Patent: Aug. 21, 2001

(54) METHOD OF FORMING A NODE CONTACT HOLE ON A SEMICONDUCTOR WAFER

(75) Inventors: Benjamin Szu-Min Lin; Jung-Chao Chiou, both of Hsin-Chu; Chin-Hui Lee, Taipei; Chuan-Fu Wang, San-Chung, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/421,261

(22) Filed: Oct. 20, 1999

(51) Int. Cl.[7] .................................................. H01L 21/8242
(52) U.S. Cl. .......................... 438/238; 438/239; 438/253
(58) Field of Search ...................................... 438/238–240, 438/250–256, 393–399

(56) References Cited

U.S. PATENT DOCUMENTS 5,759,889 * 6/1998 Sakao ...................................... 438/241
5,874,332 * 2/1999 Ema .

* cited by examiner

Primary Examiner—Jey Tsai
(74) Attorney, Agent, or Firm—Winston Hsu

(57) ABSTRACT

The present invention provides a method of forming a node contact hole on a semiconductor wafer. The semiconductor wafer comprises a silicon substrate, a first dielectric layer positioned on the silicon substrate, two bit lines positioned on the first dielectric layer which form a first groove between the two bit lines and the surface of the first dielectric layer, and a second dielectric layer positioned on each of the two bit lines. A lithographic process is performed to form a photoresist layer on the second dielectric layer with at least one second groove extending down to the second dielectric layer wherein the second groove is positioned above the first groove and is perpendicular to the first groove. An etching process is performed along the second groove of the photoresist layer to remove the second dielectric layer and the first dielectric layer under the second groove down to the surface of the silicon substrate so as to approximately form the node contact hole. Finally, a spacer is formed using an insulating material on the walls of the node contact hole to complete the node contact hole. The spacer completely covers the walls of the two bit lines within the node contact hole but the surface of the silicon substrate exposed at the bottom of the node contact hole is not completely covered by the spacer.

11 Claims, 16 Drawing Sheets

METHOD OF FORMING A NODE CONTACT HOLE ON A SEMICONDUCTOR WAFER

BACKGROUND OF THE INVENTION

1. Field of the Invention

The present invention relates to a method of forming a contact hole, and more particularly, to a method of forming a node contact hole on a semiconductor wafer.

2. Description of the Prior Art

A memory cell of dynamic random access memory (DRAM) comprises a transistor and a capacitor that is stacked on the transistor. The transistor is used as a switch for controlling a bit line and reading the data stored in the capacitor. The electrical connection between the transistor and the bottom electrode of the capacitor is a conductor-filled node contact hole. Generally, a self-alignment contact (SAC) process is performed to form the node contact hole, which accurately defines the position of the node contact hole through the area between two bit lines.

Please refer to FIG. 1, FIG. 2A and FIG. 2B. FIG. 1 is an overhead schematic diagram of a semiconductor wafer 10 according to the prior art. FIG. 2A is a cross-sectional schematic diagram along line a—a of the semiconductor wafer 10 shown in FIG. 1. FIG. 2B is a cross-sectional schematic diagram along line b—b of the semiconductor wafer 10 shown in FIG. 1. A semiconductor wafer 10 comprises a silicon substrate 12, a plurality of approximately square cross-sectional word lines 14 positioned on the silicon substrate 12, a bottom dielectric layer 20 positioned on each word line 14, a first dielectric layer 22 positioned on the bottom dielectric layer 20, two bit lines 24 positioned on two predetermined areas of the first dielectric layer 22, and a second dielectric layer 28 covering the first dielectric layer 22 and the two bit lines 24. The vertical faces of each word line 14 are covered by a first spacer 16. The vertical faces of each bit line 24 are covered by a second spacer 26. The semiconductor wafer 10 further comprises a landing pad 18 that protrudes from the silicon substrate 12 and is inlaid between two adjacent first spacers 16.

Please refer to FIG. 3, FIG. 4A and FIG. 4B. FIG. 3 is an overhead schematic diagram of a photoresist layer 30 formed on the semiconductor wafer 10 shown in FIG. 1 during a node contact hole process using a self-alignment contact technique. FIG. 4A is a cross-sectional schematic diagram along line c—c of the semiconductor wafer 10 shown in FIG. 3. FIG. 4B is a cross-sectional schematic diagram along line d—d of the semiconductor wafer 10 shown in FIG. 3. During a node contact hole process using a self-alignment contact technique, a lithographic process is first performed to form a photoresist layer 30 on the semiconductor wafer 10 wherein the photoresist layer 30 comprises at least one opening 32 to the second dielectric layer 28 to define the position of the node contact hole. The opening 32 is positioned between the two adjacent second spacers 26 and the two adjacent first spacers 16. Consequently, the photoresist layer 30 for a DRAM would have a plurality of openings 32 arranged as a matrix.

Please refer to FIG. 5A and FIG. 5B. FIG. 5A is a cross-sectional schematic diagram of a node contact hole 34 formed on the semiconductor wafer 10 shown in FIG. 4A. FIG. 5B is a cross-sectional schematic diagram of a node contact hole 34 formed on the semiconductor wafer 10 shown in FIG. 4B. After the photoresist layer 30 is completed, an anisotropic dry etching process is performed. In a condition that the first spacers 16 and the second spacers 26 can't be removed, the second dielectric layer 28 and the first dielectric layer 22 under the opening 32 of the photoresist layer 30 are vertically removed so as to form a node contact hole 34. Finally, the photoresist layer 30 is removed to complete the node contact hole process.

Please refer to FIG. 6A and FIG. 6B. FIG. 6A is a cross-sectional diagram of a bottom electrode of a capacitor formed within the node contact hole 34 shown in FIG. 5A. FIG. 6B is a cross-sectional diagram of a bottom electrode of a capacitor formed within the node contact hole 34 shown in FIG. 5B. After the node contact hole 34 is completed, a bottom electrode of a capacitor can be formed within the node contact hole 34. First, a polysilicon layer 36 is formed on the semiconductor wafer 10 that fills the node contact hole 34. Then, the polysilicon layer 36 positioned outside a predetermined area is removed which leaves the remaining polysilicon layer 36 inlaid with the node contact hole 34. The bottom of the remaining polysilicon layer 36 is in contact with the landing pad 18 to electrically connect to the transistor of the semiconductor wafer 10. The top of the remaining polysilicon layer 36 protruding from the second dielectric layer 28 is used as the bottom electrode of the capacitor.

The position of the node contact hole 34 is defined by using a self-alignment technique along the opening 32 of the photoresist layer 30. Hence, the parameters of the lithographic process must be carefully controlled to ensure the accuracy of the position of the opening 32, thereby ensuring the accuracy of the position of the node contact hole 34.

As the pattern of the DRAM shrinks, the distance between two adjacent node contact holes 34 becomes shorter. Consequently, the openings 32 of the photoresist layer 30 must be formed closer to each other. However, when an exposure process is performed on this smaller pattern during the lithographic process, the resolution of the pattern is reduced because of the difficulty in controlling the exposure energy and focus length for the matrix arrangement of openings 32. The lowered resolution will decrease the accuracy in defining the position of the opening 32 and bring about many adverse influences on the properties of the subsequently formed node contact hole 34.

SUMMARY OF THE INVENTION

It is therefore a primary objective of the present invention to provide a method of forming a node contact hole on a semiconductor wafer that can exactly define the position of the node contact hole and ensure the accuracy of the position of the node contact hole when the distance between two node contact holes becomes smaller.

In a preferred embodiment, the present invention provides a method of forming a node contact hole on a semiconductor wafer, the semiconductor wafer comprising a silicon substrate, a first dielectric layer positioned on the silicon substrate, two bit lines positioned on the first dielectric layer which form a first groove among the two bit lines and the surface of the first dielectric layer, and a second dielectric layer positioned on each of the two bit lines, the method comprising:

performing a lithographic process to form a photoresist layer on the second dielectric layer which comprises at least one second groove extending down to the second dielectric layer wherein the second groove is positioned above the first groove and is perpendicular to the first groove;

performing an etching process along the second groove of the photoresist layer to remove the second dielectric layer and the first dielectric layer under the second groove down to the surface of the silicon substrate so as to approximately form the node contact hole; and forming a spacer by using an insulating material on the walls of the node contact hole to complete the node contact hole over which the spacer completely covers the walls of the two bit lines within the node contact hole but the surface of the silicon substrate exposed at the bottom of the node contact hole is not completely covered by the spacer.

It is an advantage of the present invention that the method of forming the node contact hole on the semiconductor wafer can ensure the accuracy of the position of the node contact hole and the accuracy won't be reduced as the pattern of the DRAM shrinks.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
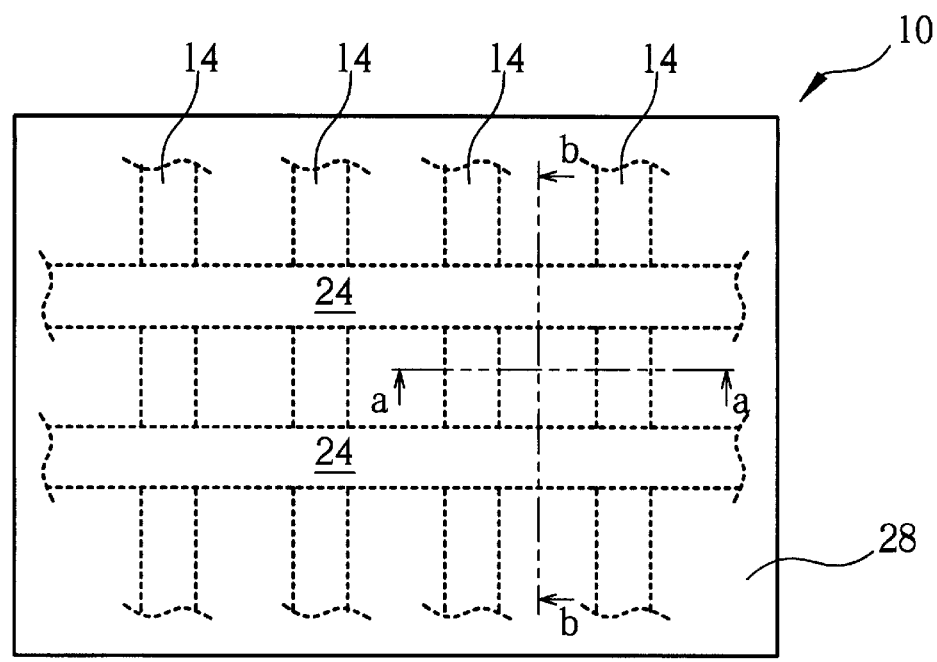
FIG. 1 is an overhead schematic diagram of a semiconductor wafer according to the prior art.
Figure 2A:
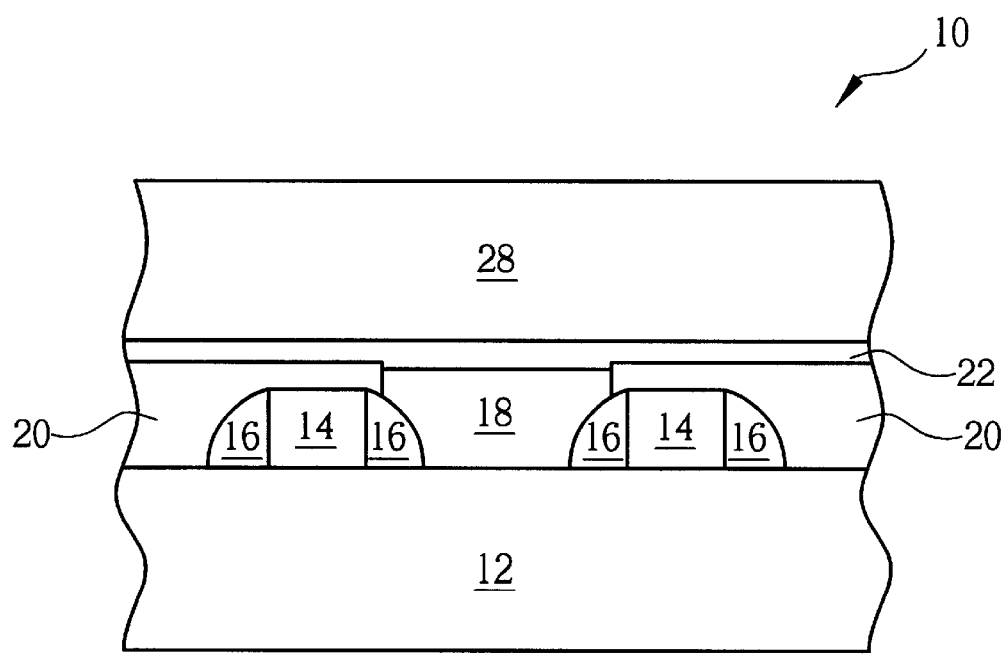
FIG. 2A is a cross-sectional schematic diagram along line a—a of the semiconductor wafer shown in FIG. 1.
Figure 2B:
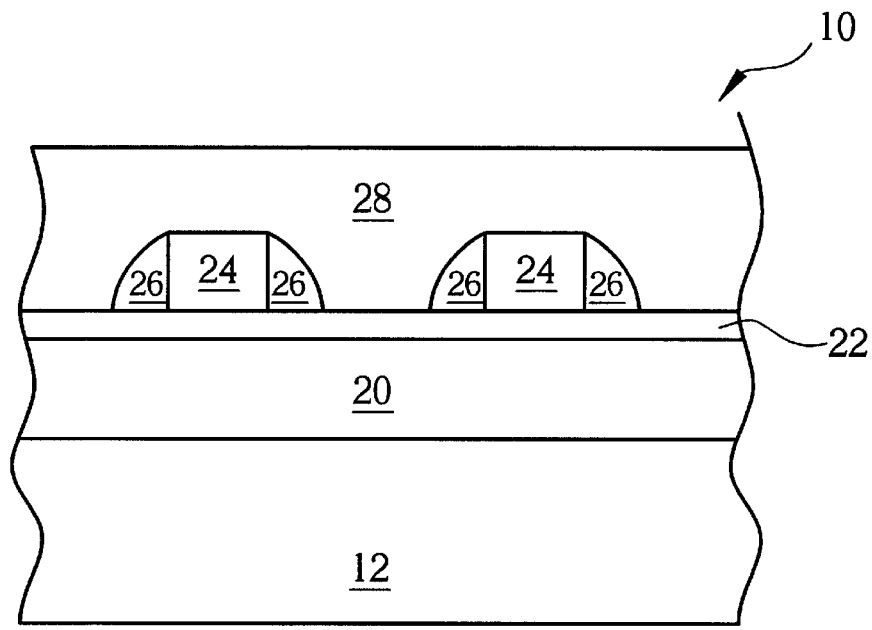
FIG. 2B is a cross-sectional schematic diagram along line b—b of the semiconductor wafer shown in FIG. 1.
Figure 3:
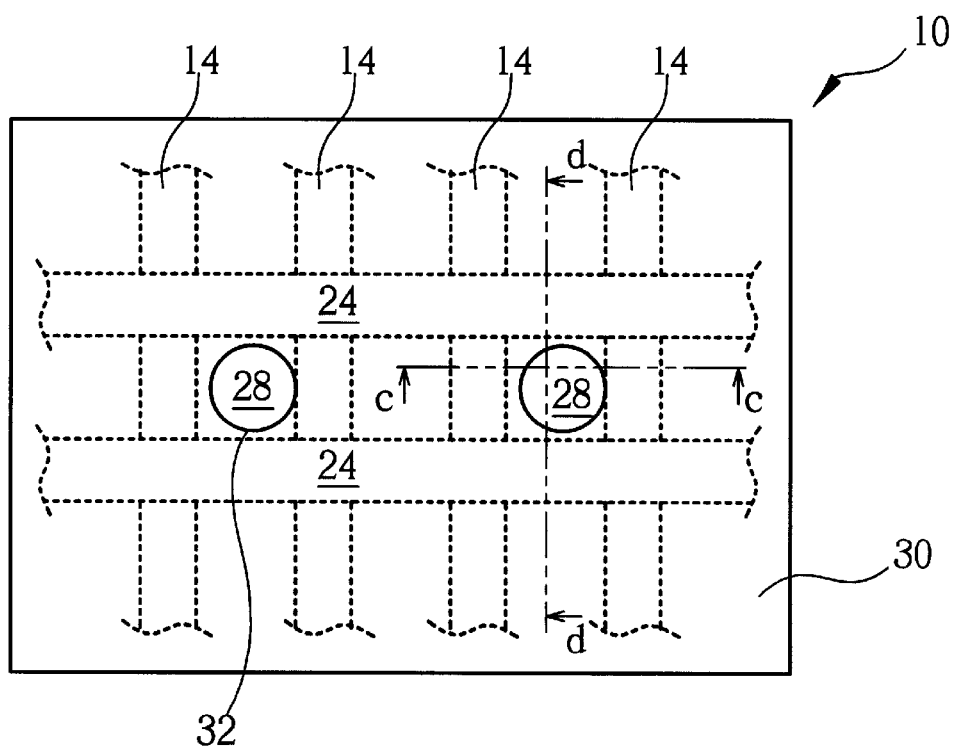
FIG. 3 is an overhead schematic diagram of a photoresist layer formed on the semiconductor wafer shown in FIG. 1 during a node contact hole process using a self-alignment contact technique.
Figure 4A:
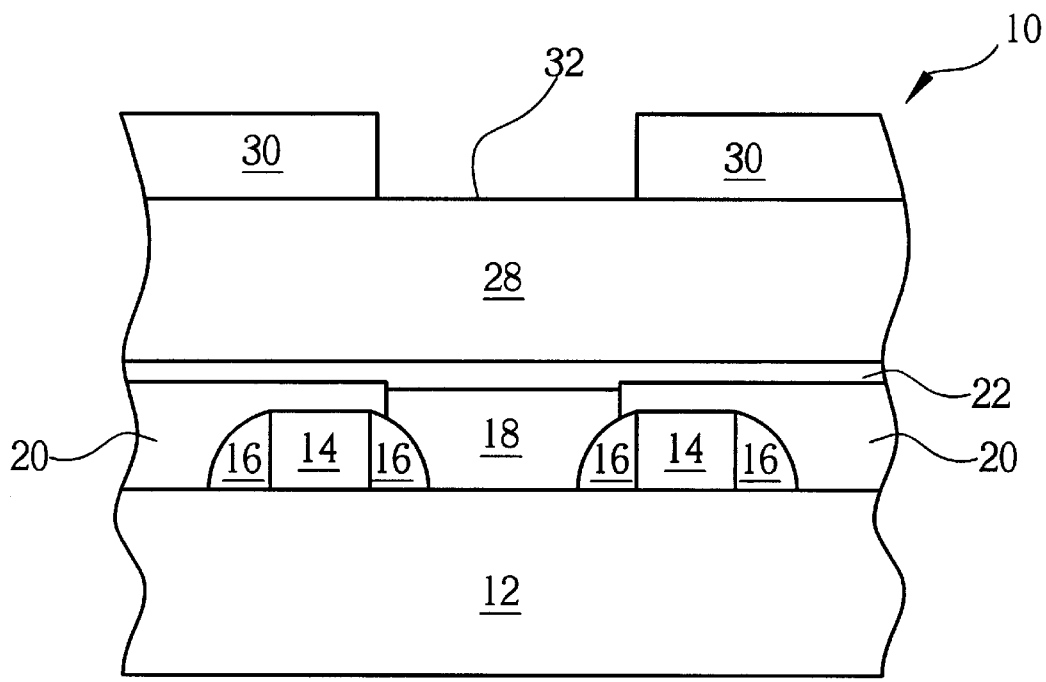
FIG. 4A is a cross-sectional schematic diagram along line c—c of the semiconductor wafer shown in FIG. 3.
Figure 4B:
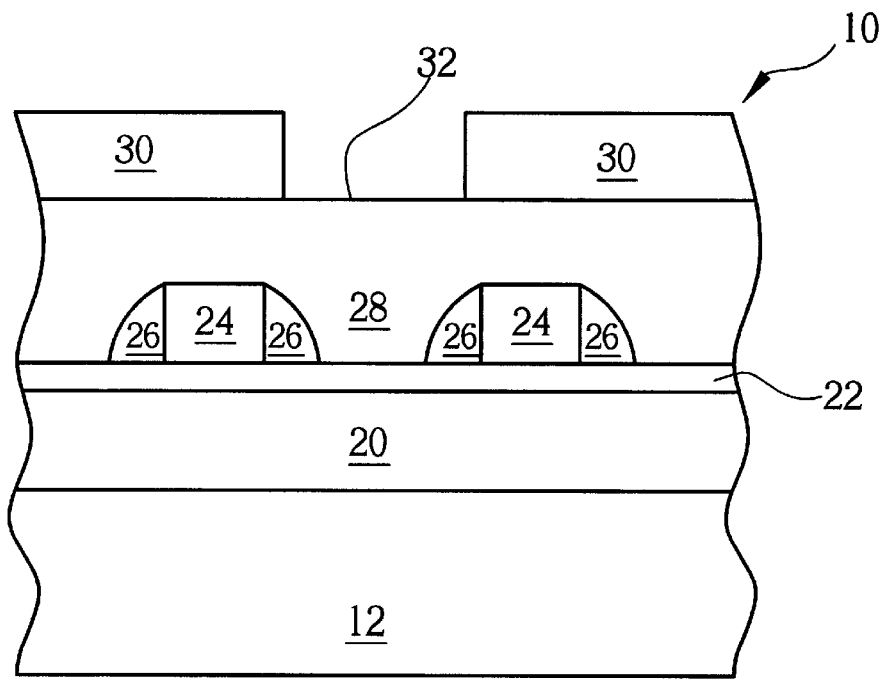
FIG. 4B is a cross-sectional schematic diagram along line d—d of the semiconductor wafer 10 shown in FIG. 3.
Figure 5A:
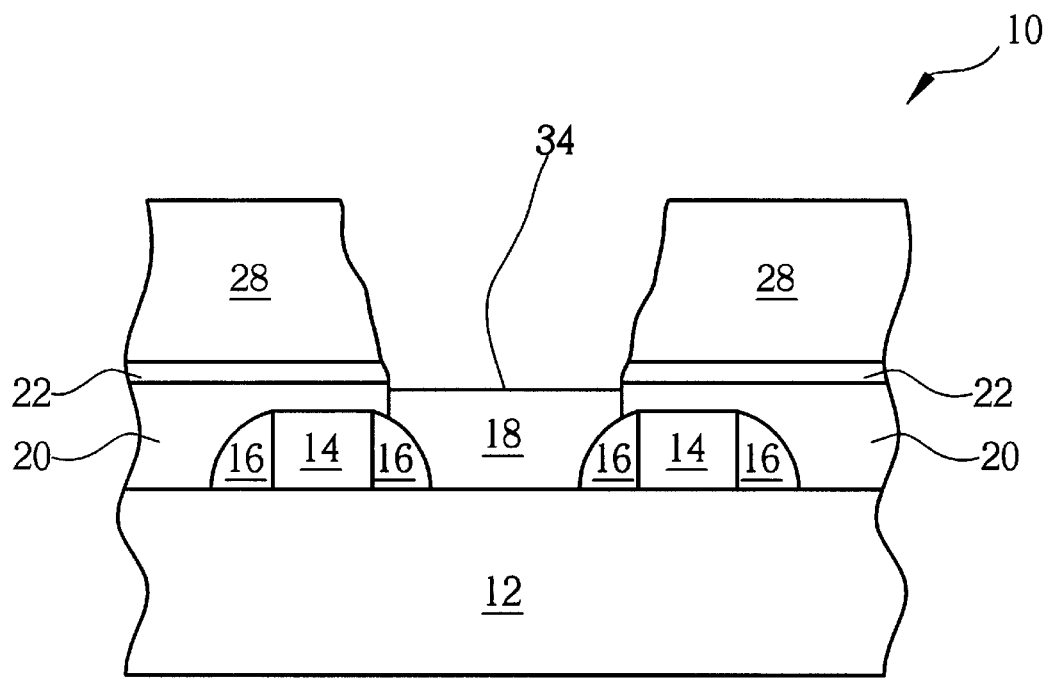
FIG. 5A is a cross-sectional schematic diagram of a node contact hole formed on the semiconductor wafer 10 shown in FIG. 4A.
Figure 5B:
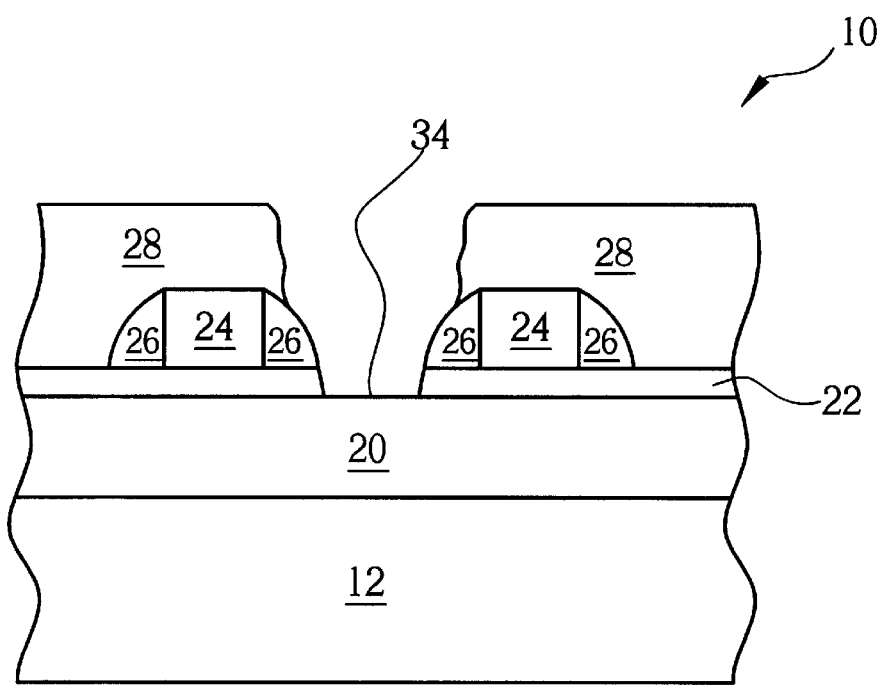
FIG. 5B is a cross-sectional schematic diagram of a node contact hole formed on the semiconductor wafer shown in FIG. 4B.
Figure 6A:
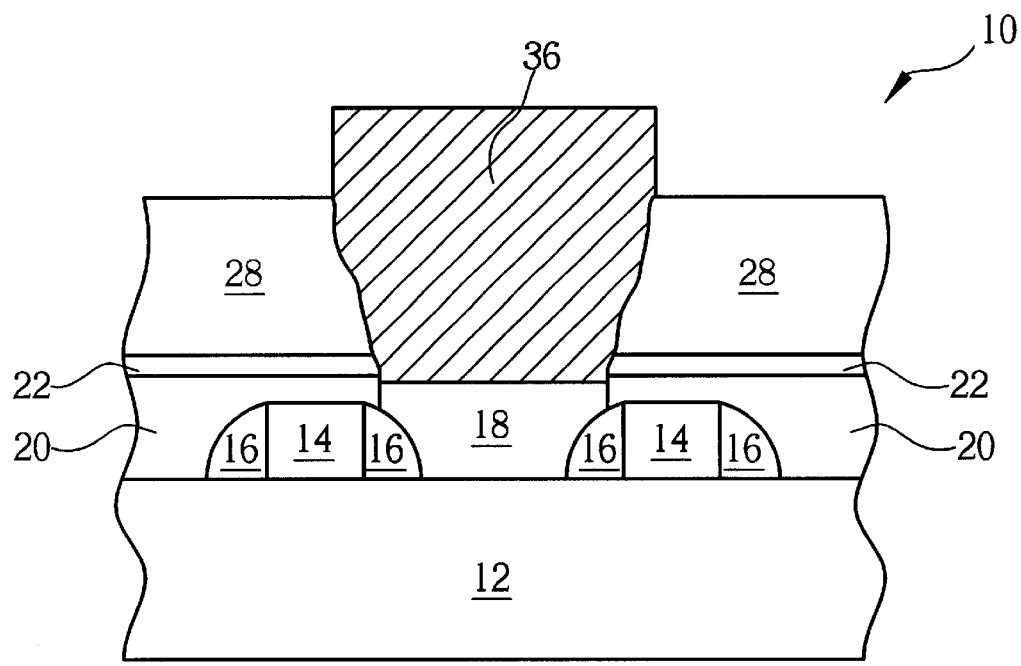
FIG. 6A is a cross-sectional diagram of a bottom electrode of a capacitor formed within the node contact hole shown in FIG. 5A.
Figure 6B:
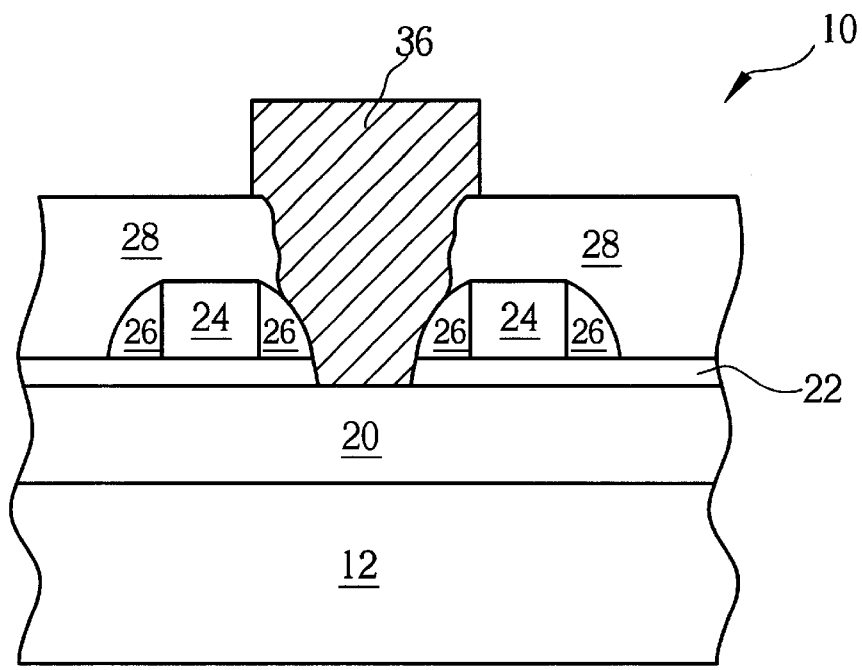
FIG. 6B is a cross-sectional diagram of a bottom electrode of a capacitor formed within the node contact hole shown in FIG. 5B.
Figure 7:
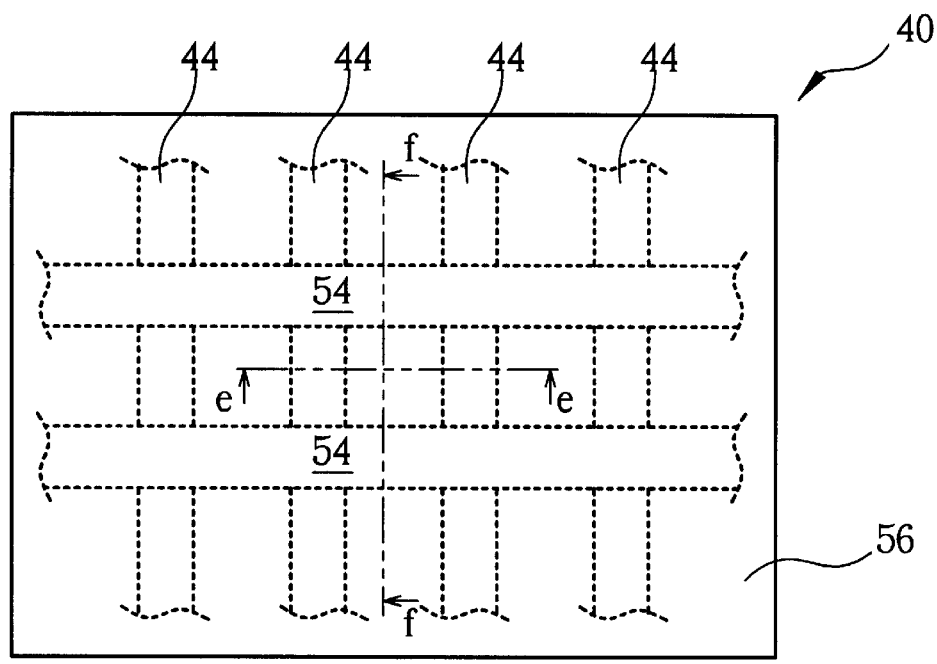
FIG. 7 is an overhead schematic diagram of a semiconductor wafer used to form a node contact hole according to the present invention.
Figure 8A:
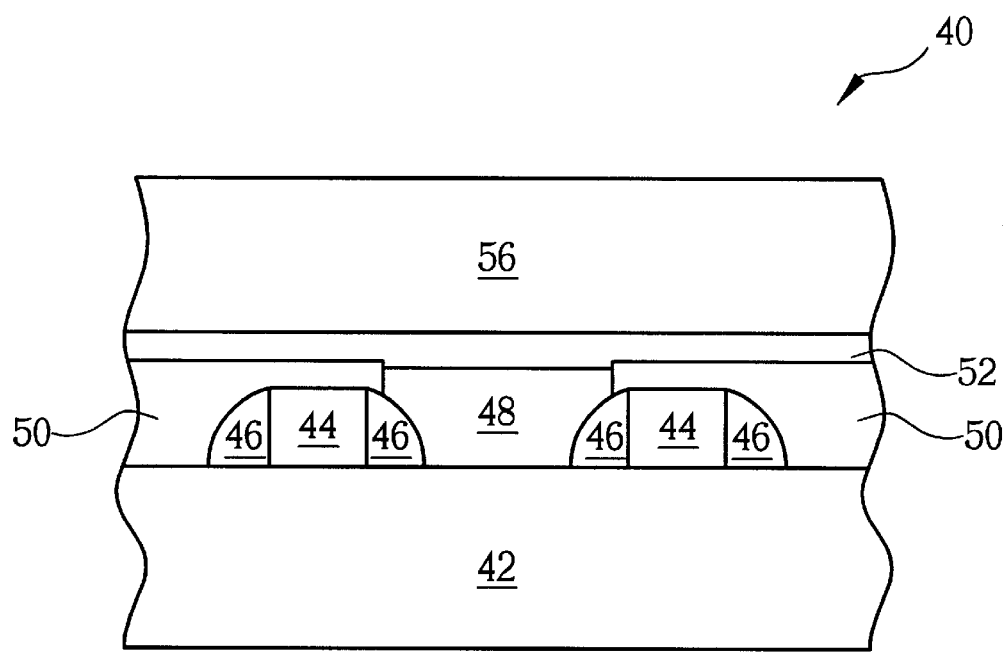
FIG. 8A is a cross-sectional schematic diagram along line e—e of the semiconductor wafer shown in FIG. 7.
Figure 8B:
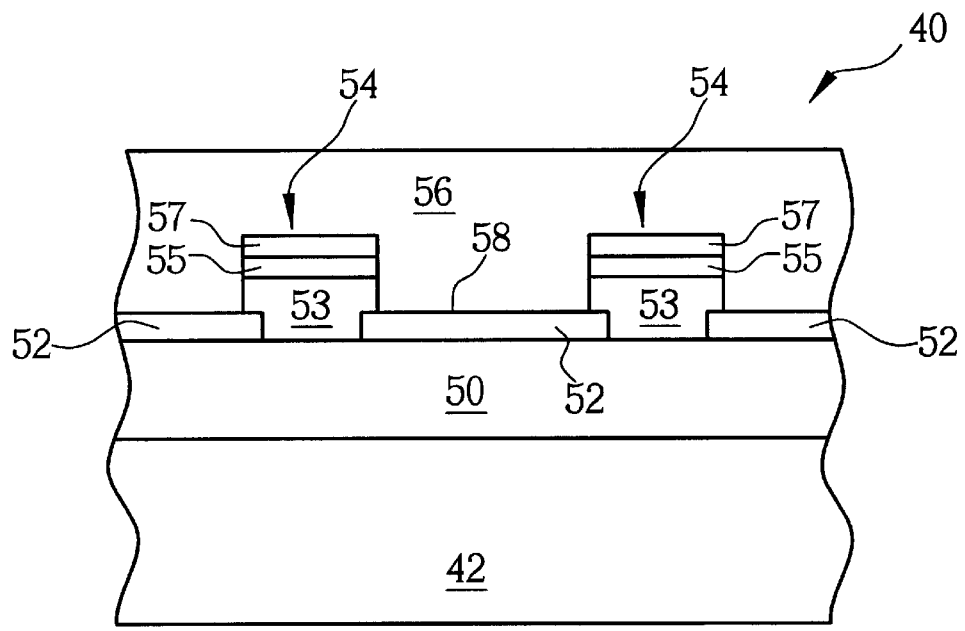
FIG. 8B is a cross-sectional schematic diagram along line f—f of the semiconductor wafer shown in FIG. 7.

Please refer to FIG. 7, FIG. 8A and FIG. 8B. FIG. 7 shows an overhead schematic diagram of a semiconductor wafer 40 that is used to form a node contact hole according to the present invention. FIG. 8A is a cross-sectional schematic diagram along line e—e of the semiconductor wafer 40 shown in FIG. 7. FIG. 8B is a cross-sectional schematic diagram along line f—f of the semiconductor wafer 40 shown in FIG. 7. The present invention provides a method of forming a node contact hole, which is performed on the semiconductor wafer 40. The semiconductor wafer 40 comprises a silicon substrate 42, a plurality of word lines 44 positioned on the silicon substrate 42, a bottom dielectric layer 50 positioned on each of the word lines 44, a first dielectric layer 52 positioned on the bottom dielectric layer 50, two bit lines 54 positioned on a predetermined area of the first dielectric layer 52, and a second dielectric layer 56 positioned on each of the two bit lines 54 and the first dielectric layer 52.

The first dielectric layer 52 and the second dielectric layer 56 are both formed from silicon oxide. The sides of each word line 44 are covered by a first spacer 46. The semiconductor wafer 40 further comprises a landing pad 48 protruding from the silicon substrate 42 that is inlaid between two adjacent first spacers 46. Each of the two bit lines 54 comprises a polysilicon layer 53 positioned on the first dielectric layer 52, a tungsten silicon layer 55 positioned on the polysilicon layer 53, and a first silicon nitride layer 57 positioned on the tungsten silicon layer 55. The two bit lines 54 and the surface of the first dielectric layer 52 form a first groove 58.

Figure 9:
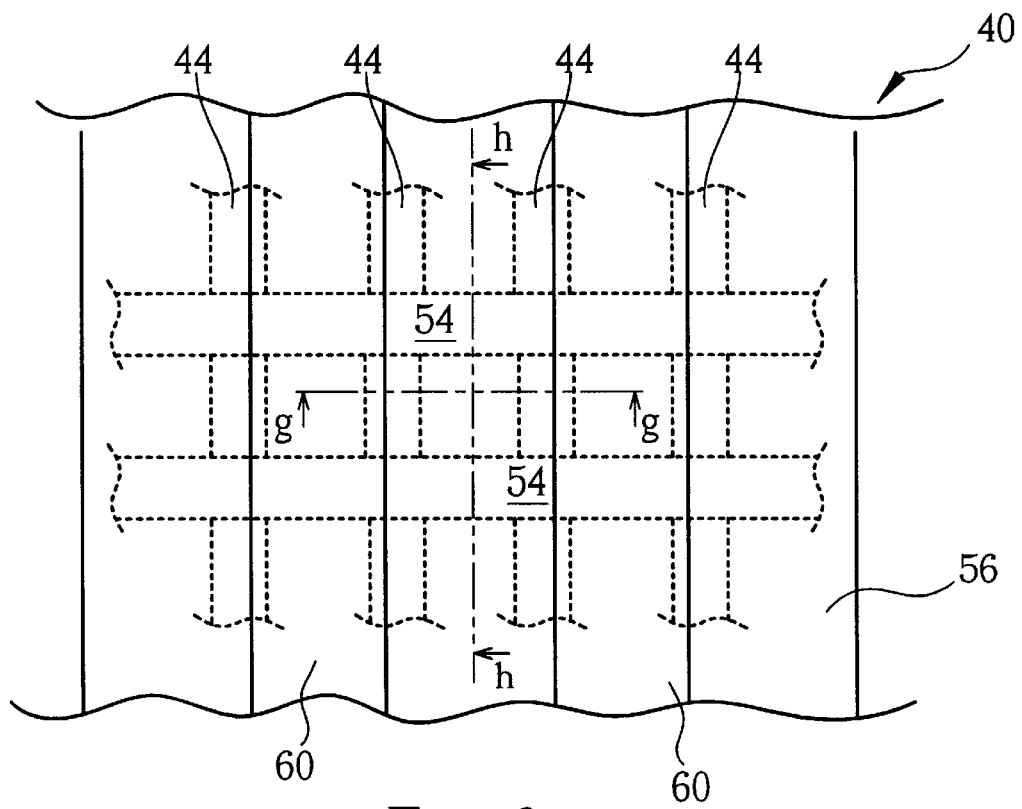
FIG.9 is an overhead schematic diagram of a photoresist layer and a second groove formed on the semiconductor wafer shown in FIG. 7.
Figure 10A:
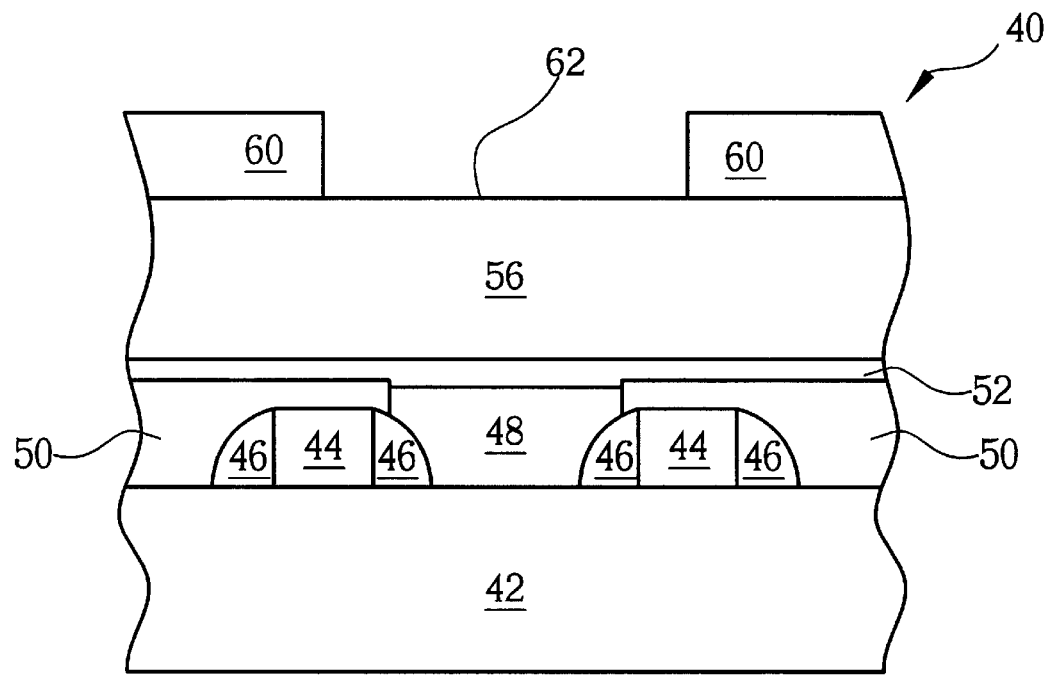
FIG. 10A is a cross-sectional diagram along line g—g of the semiconductor wafer shown in FIG. 9.
Figure 10B:
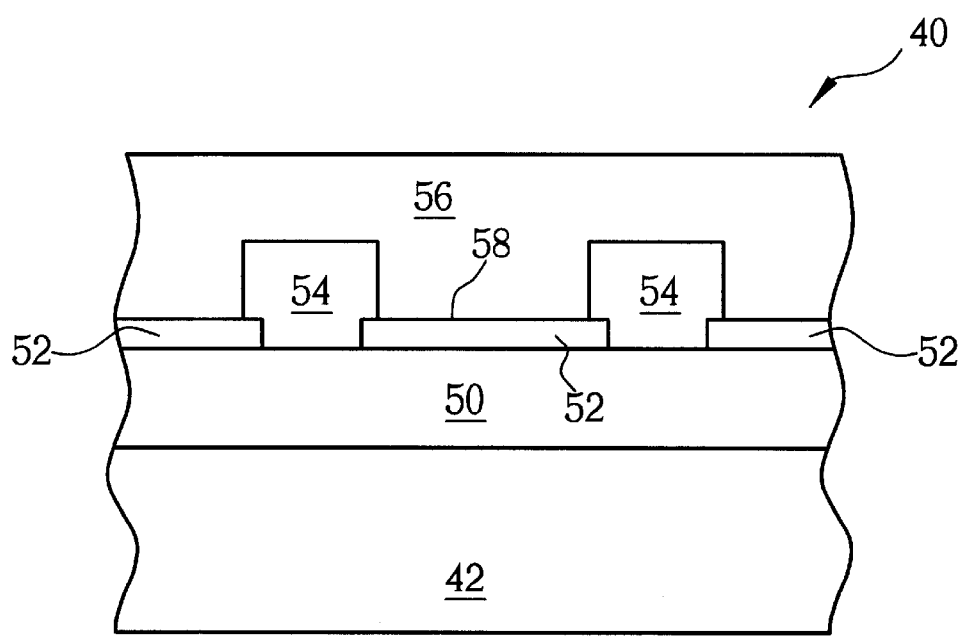
FIG. 10B is a cross-sectional diagram along line h—h of the semiconductor wafer shown in FIG. 9.

Please refer to FIG. 9, FIG. 10A and FIG. 10B. FIG. 9 is an overhead schematic diagram of a photoresist layer 60. FIG. 10A is a cross-sectional diagram along line g—g of the semiconductor wafer 40 shown in FIG. 9, and it shows a second groove 62 formed on the semiconductor wafer 40. FIG. 10B is a cross-sectional diagram along line h—h of the semiconductor wafer 40 shown in FIG. 9.

In the method of forming a node contact hole on the semiconductor wafer 40 according to the present invention, a lithographic process is first performed to form at least one line-shaped photoresist layer 60 on a predetermined area of the second dielectric layer 56. The photoresist layer 60 comprises at least one second groove 62 extending down to the second dielectric layer 56 wherein the second groove 62 is positioned above the first groove 58 and is perpendicular to the first groove 58.

Figure 11A:
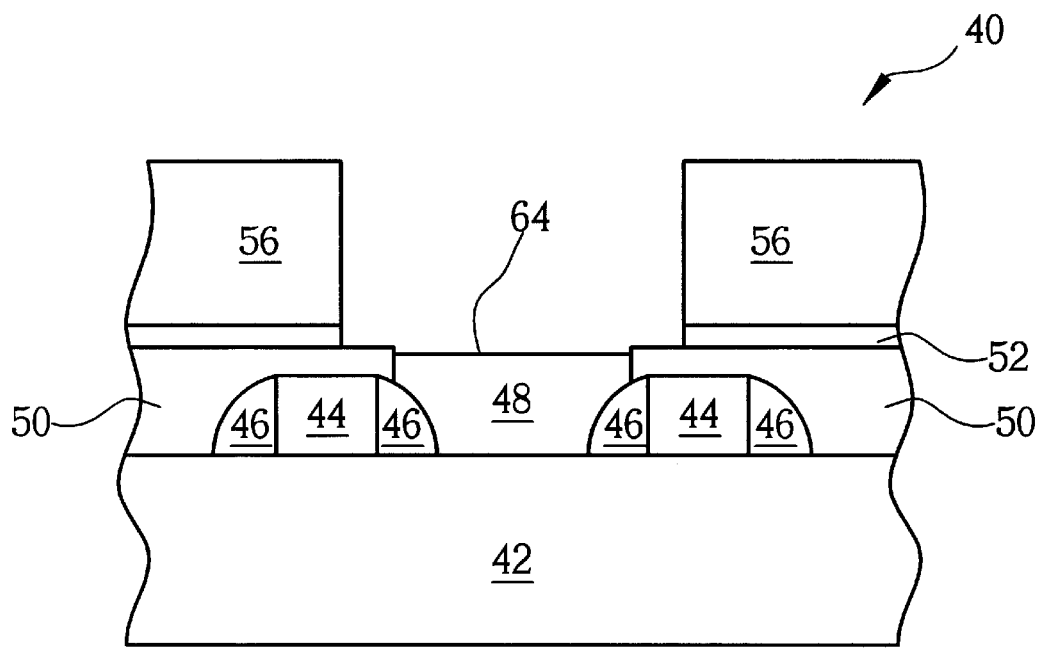
FIG. 11A is a cross-sectional schematic diagram of a node contact hole approximately formed on the semiconductor wafer shown in FIG. 10A.
Figure 11B:
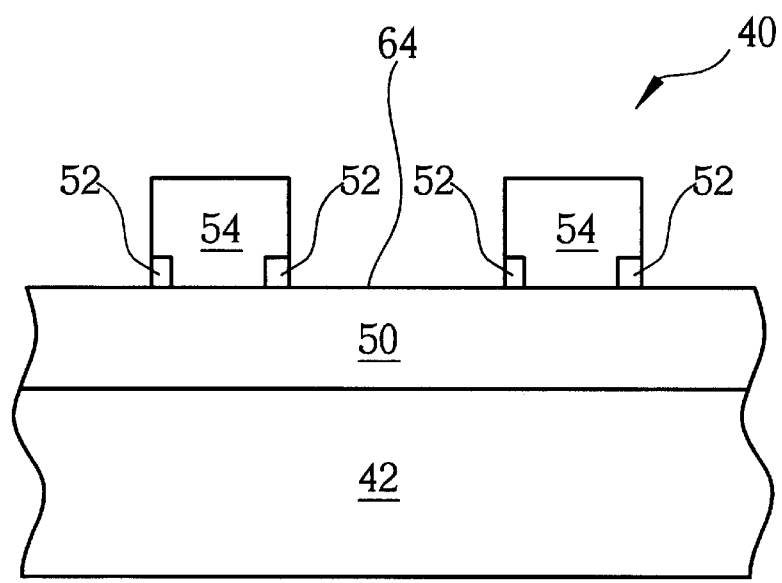
FIG. 11B is a cross-sectional schematic diagram of a node contact hole approximately formed on the semiconductor wafer shown in FIG. 10B.

Please refer to FIG. 11A and FIG. 11B. FIG. 11A is a cross-sectional schematic diagram of the node contact hole 64 approximately formed on the semiconductor wafer 40 shown in FIG. 10A. FIG. 11B is a cross-sectional schematic diagram of the node contact hole 64 approximately formed on the semiconductor wafer 40 shown in FIG. 10B. After the photoresist layer 60 and the second groove 62 are completed, an etching process is performed to vertically remove the second dielectric layer 56 and the first dielectric layer 52 under the second groove 62 down to the surface of the landing pad 48 so as to approximately form the node contact hole 64 as shown in FIG. 11A. Also, the second dielectric layer 56 and the first dielectric layer 52 not covered by the photoresist layer 60 are removed down to the surface of the bottom dielectric layer 50, using the two bit lines 54 as two hard masks so as to approximately form the node contact hole 64 between the two bit lines 54 as shown in FIG. 11B.

Figure 12A:
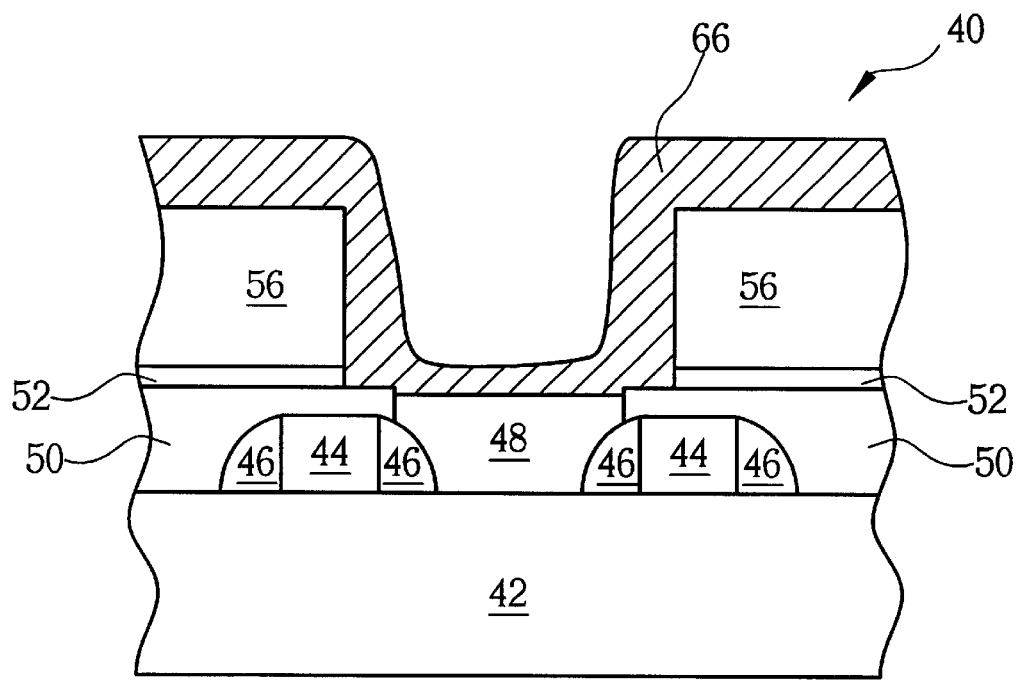
FIG. 12A is a cross-sectional schematic diagram of an insulating layer formed on the semiconductor wafer shown in FIG. 11A.
Figure 12B:
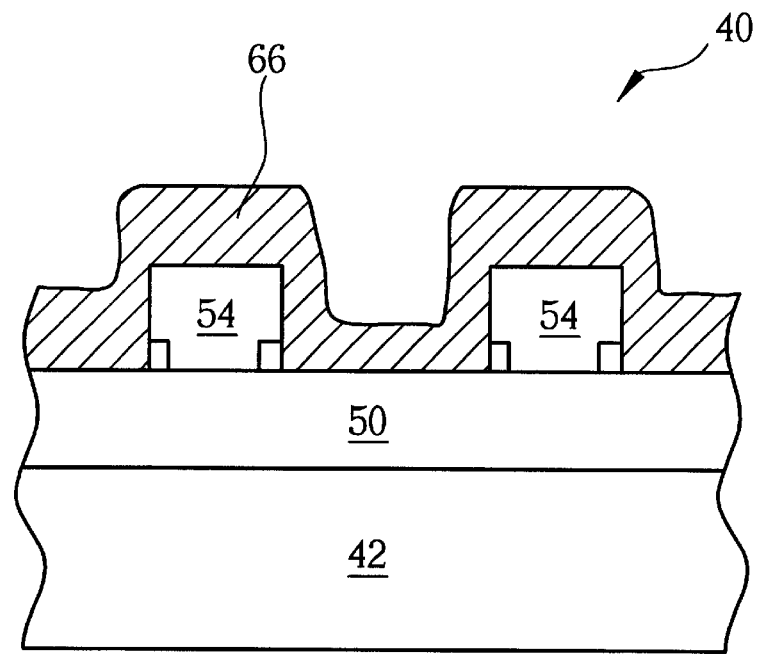
FIG. 12B is a cross-sectional schematic diagram of an insulating layer formed on the semiconductor wafer shown in FIG. 11B.
Figure 13A:
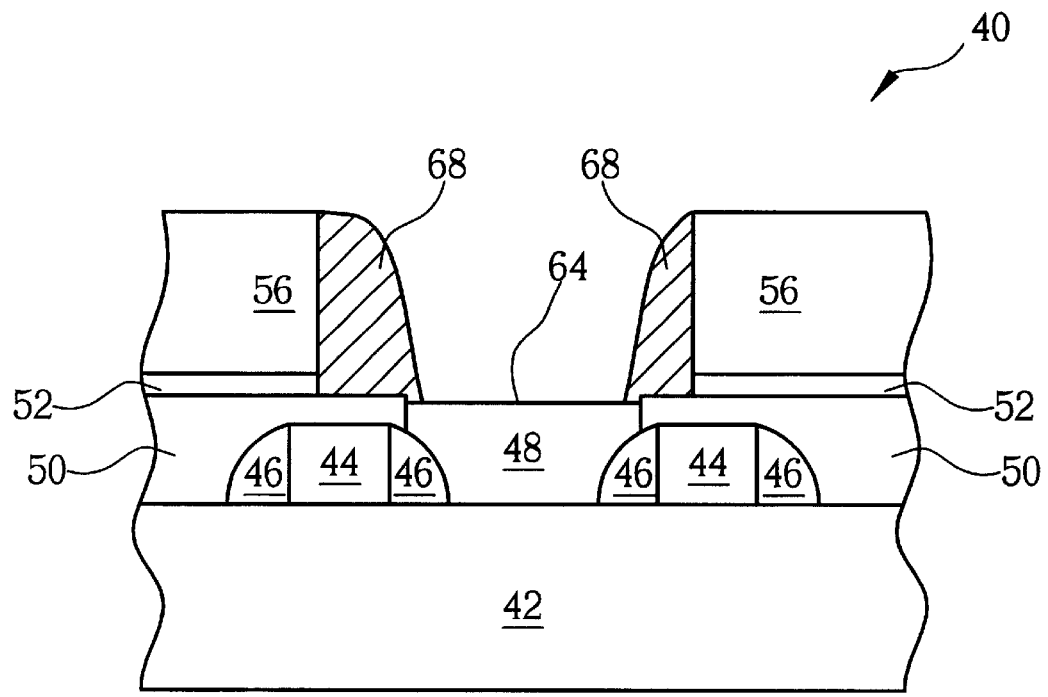
FIG. 13A is a cross-sectional schematic diagram of the node contact hole completed on the semiconductor wafer shown in FIG. 12A.
Figure 13B:
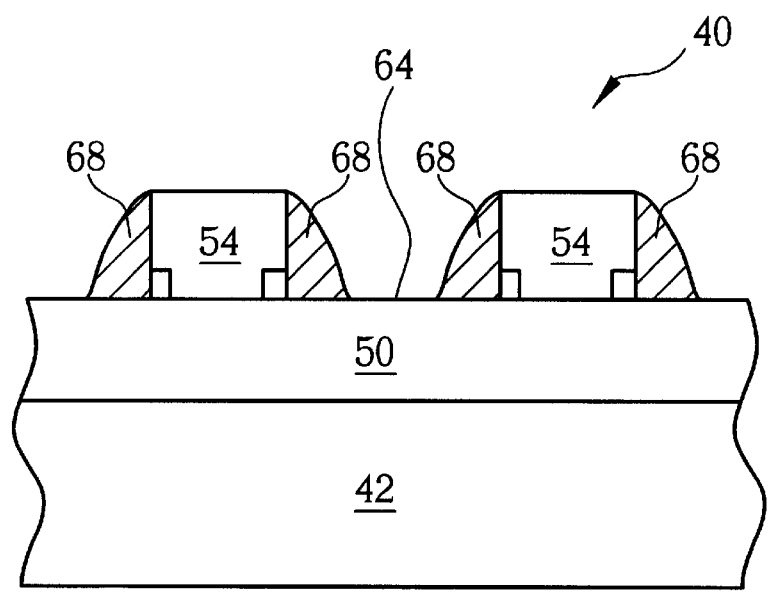
FIG. 13B is a cross-sectional schematic diagram of the node contact hole completed on the semiconductor wafer shown in FIG. 12B.

Please refer to FIG. 12A to FIG. 13B. FIG. 12A is a cross-sectional schematic diagram of an insulating layer 66 formed on the semiconductor wafer 40 shown in FIG. 11A. FIG. 12B is a cross-sectional schematic diagram of an insulating layer 66 formed on the semiconductor wafer 40 shown in FIG. 11B. FIG. 13A is a cross-sectional schematic diagram of the node contact hole 64 completed on the semiconductor wafer 40 shown in FIG. 12A. FIG. 13B is a cross-sectional schematic diagram of the node contact hole 64 completed on the semiconductor wafer 40 shown in FIG. 12B. When the node contact hole 64 is approximately formed on the semiconductor wafer 40, an insulating layer 66 made of silicon nitride is uniformly formed on the semiconductor wafer 40 that covers the surface of the node contact hole 64 as shown in FIG. 12A and FIG. 12B.

Finally, an anisotropic etching process is performed to vertically remove the insulating layer 66 at the top of the second dielectric layer 56 and on the surface of the landing pad 48 at the bottom of the node contact hole 64. The insulating layer 66 remaining on the walls of the node contact hole 64 forms a second spacer 68 as shown in FIG. 13A. At the same time, the insulating layer 66 at the top of the two bit lines 54 and on the surface of the bottom dielectric layer 50 at the bottom of the node contact hole 64 is also removed, using the two bit lines 54 as two hard masks. The insulating layer 66 remaining on the sides of the two bit lines 54 forms the second spacers 68 as shown in FIG. 13B. This completes the node contact hole 64 over which the second spacer 68 completely covers the sides of the two bit lines 54 within the node contact hole 64, but leaves an exposed surface on the landing pad 48 at the bottom of the node contact hole 64.

Figure 14A:
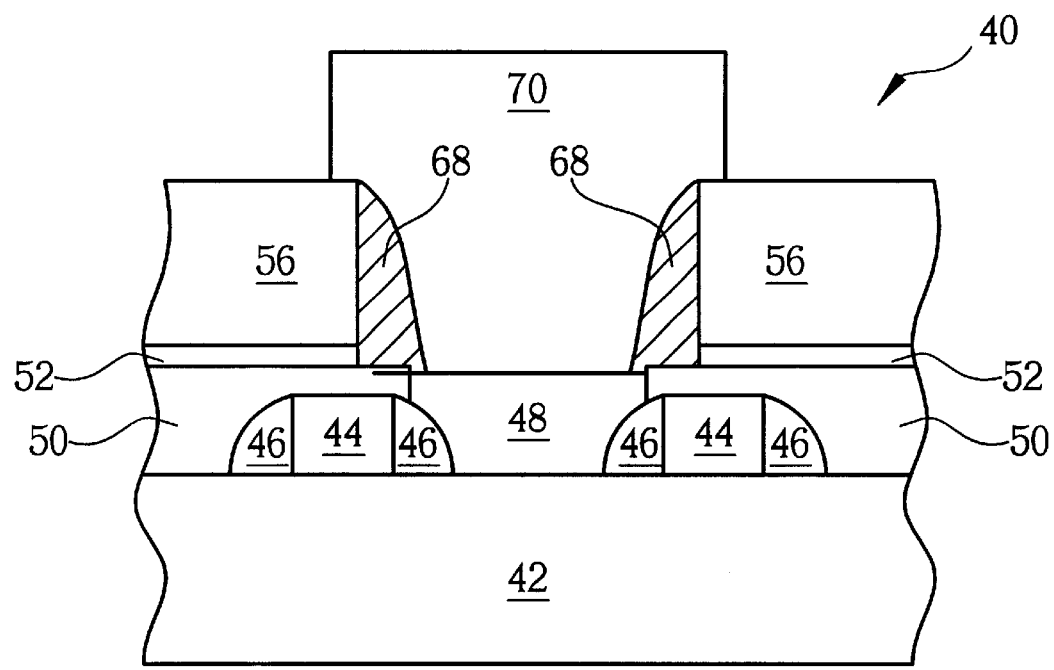
FIG. 14A is a cross-sectional schematic diagram of a bottom electrode of a capacitor formed within the node contact hole shown in FIG. 13A.
Figure 14B:
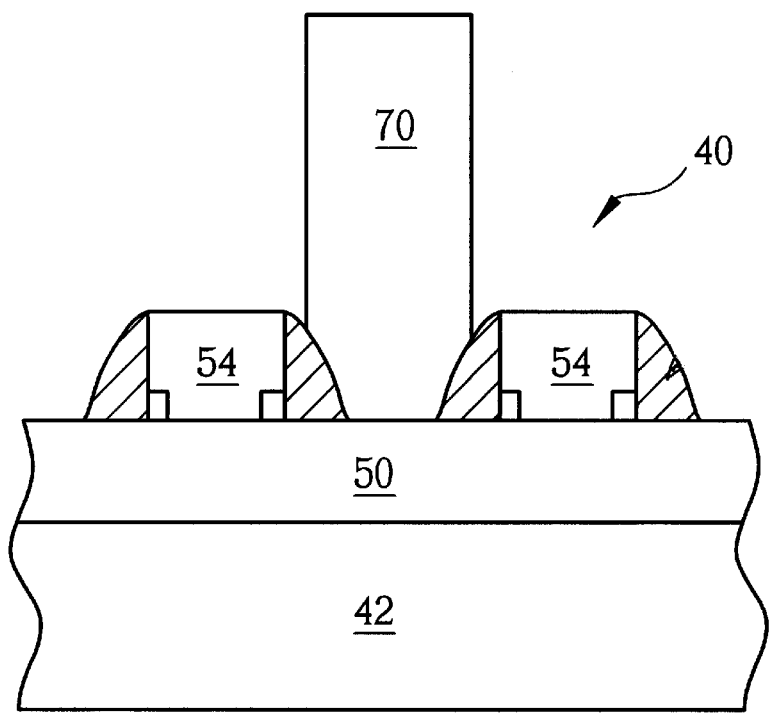
FIG. 14B is a cross-sectional schematic diagram of a bottom electrode of a capacitor formed within the node contact hole shown in FIG. 13B.

Please refer to FIG. 14A and FIG. 14B. FIG. 14A is a cross-sectional schematic diagram of a bottom electrode of a capacitor formed within the node contact hole 64 shown in FIG. 13A. FIG. 14B is a cross-sectional schematic diagram of a bottom electrode of a capacitor formed within the node contact hole 64 shown in FIG. 13B. When the node contact hole 64 is completed, a bottom electrode of a capacitor can be formed within the node contact hole 64. First, a polysilicon layer 70 is formed on the semiconductor wafer 40 to fill the space between two adjacent second spacers 68. Then, the polysilicon layer 70 positioned outside a predetermined area is removed which leaves the remaining polysilicon layer 70 inlaid in the node contact hole 64. The bottom of the remaining polysilicon layer 70 is used for electrically connecting the landing pad 48. The top of the remaining polysilicon layer 70 protruding from the surface of the second dielectric layer 56 and the two bit lines 54 is used as the bottom electrode of the capacitor.

The present invention employs the relative positions among the second groove 62 of the line-shaped photoresist layer 60 and the two bit lines 54 to exactly define the position of the node contact hole 64. Because the parameters of the lithographic process are easily optimized to form the line-shaped photoresist layer 60, the resolution of the pattern can be enhanced to ensure the accuracy of the position of the node contact hole 64. Also, a shorter distance between two node contact holes 64 can be formed by adapting to the relative positions between the second groove 62 and the two bit lines 54. It is believed that the accuracy of the position of the node contact hole 64 will not suffer, regardless of the pattern size of the DRAM.

Figure 15:
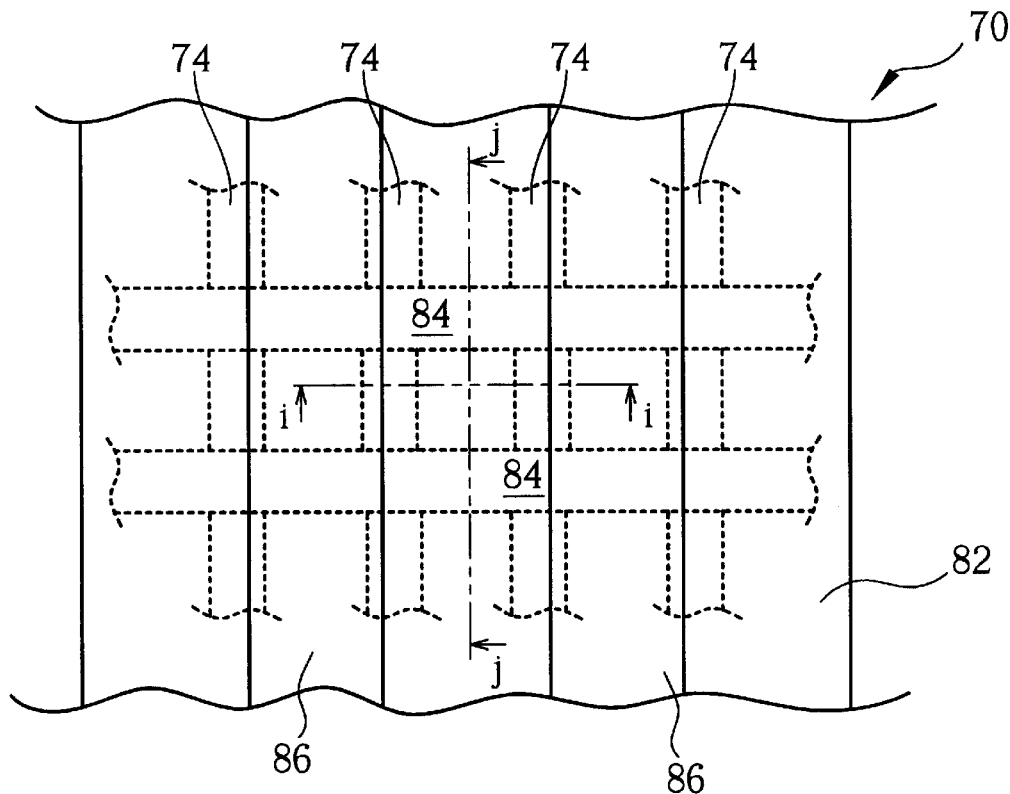
FIG. 15 is an overhead schematic diagram of a photoresist layer and a second groove 89 formed on a semiconductor wafer according to another method of the present invention.
Figure 16A:
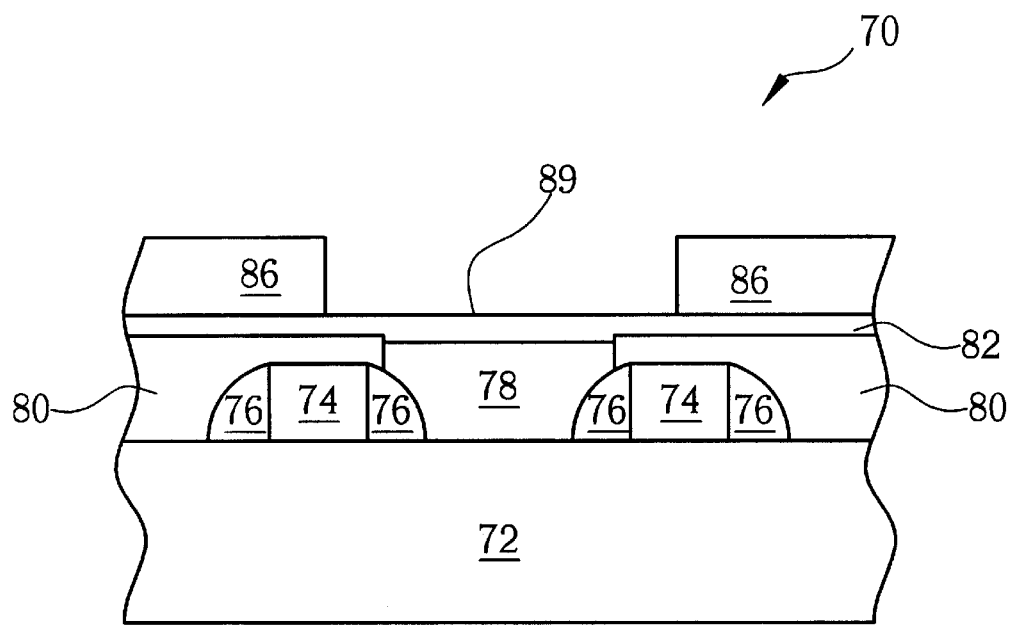
FIG. 16A is a cross-sectional diagram along line i—i of the semiconductor wafer shown in FIG. 15.
Figure 16B:
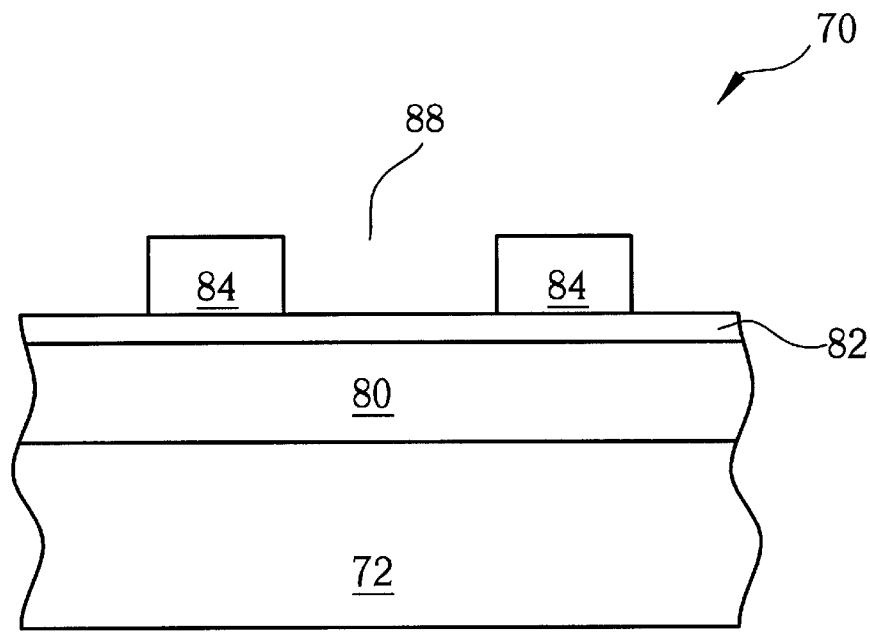
FIG. 16B is a cross-sectional diagram along line j—j of the semiconductor wafer shown in FIG. 15.

Please refer to FIG. 15 to FIG. 16B. FIG. 15 is an overhead schematic diagram of a photoresist layer 86 and a second groove 89 formed on a semiconductor wafer 70 according to another method of the present invention. FIG. 16A is a cross-sectional diagram along line i—i of the semiconductor wafer 70 shown in FIG. 15. FIG. 16B is a cross-sectional diagram along line j—j of the semiconductor wafer 70 shown in FIG. 15. The present invention provides another method of forming a node contact hole 90 on a semiconductor wafer 70. The semiconductor wafer 70 comprises a silicon substrate 72, a plurality of word lines 74, a plurality of first spacers 76, a landing pad 78, a bottom electrode layer 80, a first dielectric layer 82 and two bit lines 84. The first dielectric layer 82 is formed from silicon oxide. The two bit lines 84 are formed from a polysilicon layer, a tungsten silicon layer and a first silicon nitride layer. A first groove 88 is formed between the two bit lines 84 and the surface of the first dielectric layer 82.

In another method of forming the node contact hole, a lithographic process is first performed to form at least one line-shaped photoresist layer 86 on a predetermined area of the semiconductor wafer 70. The photoresist layer 86 comprises at least one second groove 89 extending down to the surface of the first dielectric layer 82 wherein the second groove 89 is positioned above the first groove 88 and is perpendicular to the first groove 88.

Figure 17A:
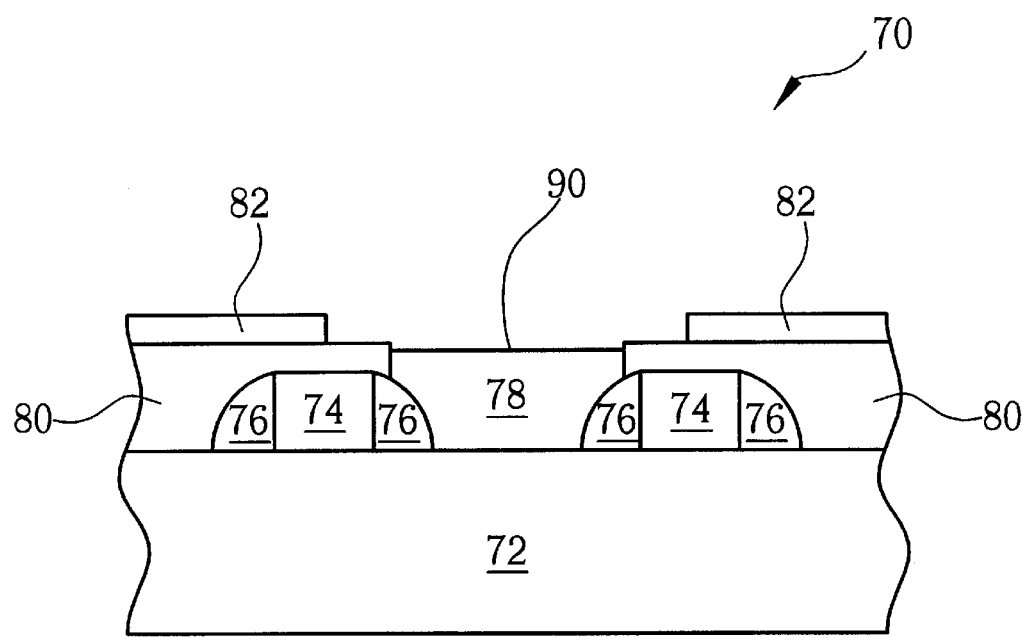
FIG. 17A is a cross-sectional schematic diagram of a node contact hole approximately formed on the semiconductor wafer shown in FIG. 16A.
Figure 17B:
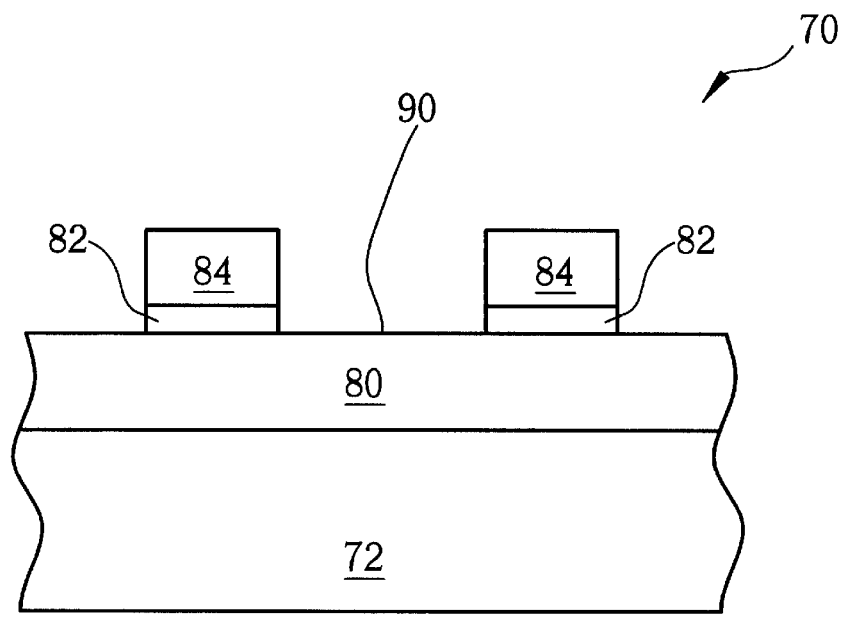
FIG. 17B is a cross-sectional schematic diagram of a node contact hole approximately formed on the semiconductor wafer shown in FIG. 16B.
Figure 18A:
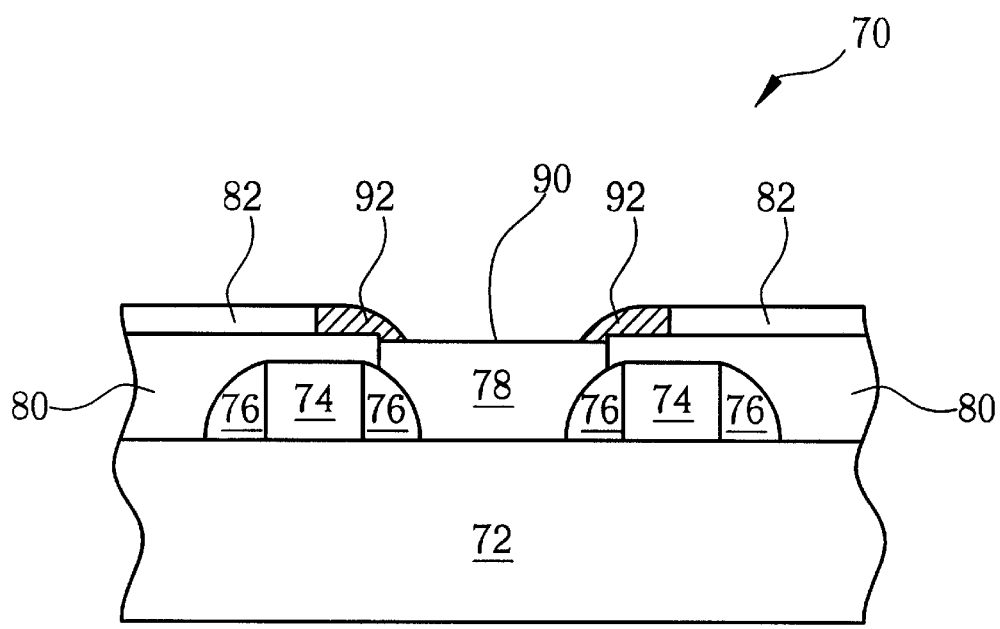
FIG. 18A is a cross-sectional schematic diagram of the node contact hole completed on the semiconductor wafer shown in FIG. 17A.
Figure 18B:
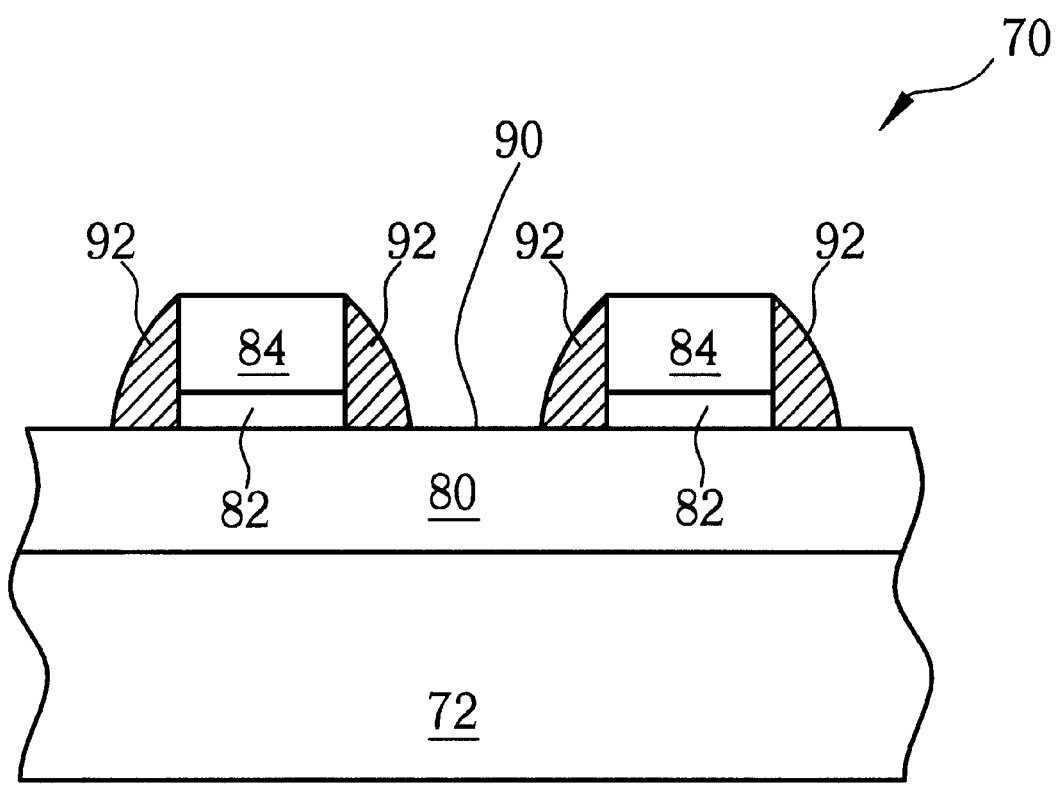
FIG. 18B is a cross-sectional schematic diagram of the node contact hole completed on the semiconductor wafer shown in FIG. 17B.

Please refer to FIG. 17A to FIG. 18B. FIG. 17A is a cross-sectional schematic diagram of a node contact hole 90 approximately formed on the semiconductor wafer 70 shown in FIG. 16A. FIG. 17B is a cross-sectional schematic diagram of a node contact hole 90 approximately formed on the semiconductor wafer 70 shown in FIG. 16B. FIG. 18A is a cross-sectional schematic diagram of the node contact hole 90 completed on the semiconductor wafer 70 shown in FIG. 17A. FIG. 18B is a cross-sectional schematic diagram of the node contact hole 90 completed on the semiconductor wafer 70 shown in FIG. 17B. When the photoresist layer 86 and the second groove 89 are completed, an etching process is performed to vertically remove the first dielectric layer 82 under the second groove 89 down to the surface of the landing pad 78 and the surface of the bottom dielectric layer 80 so as to approximately form the node contact hole 90. Then, the photoresist layer 86 is removed as shown in FIG. 17A and FIG. 17B. Next, a second spacer 92 is formed on the walls of the node contact hole 90 by using an insulating material. This completes the node contact hole 90 over which the second spacer 92 completely covers the walls of the two bit lines 84 within the node contact hole 90, but the surface of the bottom dielectric layer 80 and the landing pad 78 remain exposed at the bottom of the node contact hole 90, as shown in FIG. 18A and FIG. 18B.

Compared to the prior method of forming the node contact hole 34, in the present invention method of forming the node contact hole 60 on the semiconductor wafer 40, a relative position among the second groove 62 of the line-shaped photoresist layer 60 and the two bit lines 54 is used to exactly defined the position of the node contact hole 64. Therefore, the accuracy of the position of the node contact hole 64 isn't reduced as the pattern of the DRAM is designed smaller. Also, the parameters of the lithographic process are easily controlled to form the line-shaped photoresist layer 60. This ensures the accuracy of the position of the node contact hole 64.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a node contact hole on a semiconductor wafer, the semiconductor wafer comprising a silicon substrate, a first dielectric layer positioned on the silicon substrate, two bit lines positioned on the first dielectric layer which form a first groove among the two bit lines and the surface of the first dielectric layer, and a second dielectric layer positioned on each of the two bit lines, the method comprising:

performing a lithographic process to form a photoresist layer on the second dielectric layer which comprises at least one second groove extending down to the second dielectric layer wherein the second groove is positioned above the first groove and is perpendicular to the first groove;

performing an etching process along the second groove of the photoresist layer to remove the second dielectric layer and the first dielectric layer under the second groove down to the surface of the silicon substrate so as to approximately form the node contact hole; and forming a spacer by using an insulating material at the side walls of the node contact hole to complete the node contact hole over which the spacer completely covers the side walls of the two bit lines within the node contact hole but the surface of the silicon substrate exposed at the bottom of the node contact hole is not completely covered by the spacer.

2. The method of claim 1 wherein the first dielectric layer is made from silicon oxide.

3. The method of claim 1 wherein each of the two bit lines comprises a polysilicon layer positioned on the first dielectric layer, a silicon tungsten layer positioned on the polysilicon layer, and a first silicon nitride layer positioned on the silicon tungsten layer.

4. The method of claim 1 wherein the second dielectric layer is made from silicon oxide.

5. The method of claim 1 wherein the insulating material is made from silicon nitride.

6. The method of claim 1 wherein the spacer is formed by performing the following steps:

forming an insulating layer uniformly on the surface of the node contact hole and the second dielectric layer; and performing an anisotropic etching process to vertically remove the insulating layer positioned at the top of the second dielectric layer and on the surface of the silicon substrate at the bottom of the node contact hole so that the insulating layer remaining on the side walls of the node contact hole forms the spacer.

7. A method of forming a node contact hole on a semiconductor wafer, the semiconductor wafer comprising a silicon substrate, a first dielectric layer positioned on the silicon substrate, and two bit lines positioned on the first dielectric layer which form a first groove among the two bit lines and the surface of the first dielectric layer, the method comprising:

performing a lithographic process to form a photoresist layer on the semiconductor wafer which comprises at least one second groove extending down to the first dielectric layer wherein the second groove is positioned above the first groove and is perpendicular to the first groove;

performing an etching process to vertically remove the first dielectric layer positioned under the intersection of the second groove and the first groove down to the surface of the silicon substrate so as to approximately form the node contact hole; and forming a spacer by using an insulating material on the side walls of the node contact hole to complete the node contact hole over which the spacer completely covers the side walls of the two bit lines within the node contact hole but the surface of the silicon substrate exposed at the bottom of the node contact hole is not covered by the spacer.

8. The method of claim 7 wherein the first dielectric layer is made from silicon oxide.

9. The method of claim 7 wherein each of the two bit lines comprises a polysilicon layer positioned on the first dielectric layer, a silicon tungsten layer positioned on the polysilicon layer, and a first silicon nitride layer positioned on the silicon tungsten layer.

10. The method of claim 7 wherein the insulating material is made from silicon nitride.

11. The method of claim 7 wherein the spacer is formed by performing the following steps:

forming an insulating layer uniformly on the surface of the node contact hole, the two bit lines and the first dielectric layer; and performing an anisotropic etching process to vertically remove the insulating layer positioned at the top of the two bit lines and on the surface of the silicon substrate at the bottom of the node contact hole so that the insulating layer remaining on the side wall of the node contact hole forms the spacer.

* * * * *